United States Patent
Lee et al.

(10) Patent No.: US 8,951,810 B2
(45) Date of Patent: Feb. 10, 2015

(54) METHODS FOR FORMING INTERCONNECTION LINE USING SCREEN PRINTING TECHNIQUE

(71) Applicant: SK hynix Inc., Icheon-si (KR)

(72) Inventors: Kyu Won Lee, Seoul (KR); Cheol Ho Joh, Seoul (KR); Ji Eun Kim, Suwon-si (KR); Hee Min Shin, Cheongju-si (KR); Chong Ho Cho, Incheon (KR)

(73) Assignee: SK hynix Inc., Icheon-si (KR)

( * ) Notice: Subject to any disclaimer, the term of this patent is extended or adjusted under 35 U.S.C. 154(b) by 227 days.

(21) Appl. No.: 13/719,082

(22) Filed: Dec. 18, 2012

(65) Prior Publication Data

US 2014/0057369 A1    Feb. 27, 2014

(30) Foreign Application Priority Data

Aug. 27, 2012   (KR) .................. 10-2012-0093856

(51) Int. Cl.
*H01L 21/00* (2006.01)
*H01L 21/48* (2006.01)
*H01L 23/498* (2006.01)

(52) U.S. Cl.
CPC ...... *H01L 21/4846* (2013.01); *H01L 23/49838* (2013.01); *H01L 21/4867* (2013.01); *H01L 23/49866* (2013.01); *H01L 2924/0002* (2013.01)

USPC .............................................. 438/3; 438/660

(58) Field of Classification Search
CPC ................................................... H01L 21/4867
USPC ....................................................... 438/3, 660
See application file for complete search history.

(56) References Cited

U.S. PATENT DOCUMENTS

| 5,669,970 | A | | 9/1997 | Balog et al. | |
|---|---|---|---|---|---|
| 5,955,119 | A | * | 9/1999 | Andris et al. | 425/461 |
| 6,080,650 | A | * | 6/2000 | Edwards | 438/612 |
| 2013/0140649 | A1 | * | 6/2013 | Rogers et al. | 257/414 |

FOREIGN PATENT DOCUMENTS

| KR | 1020010047570 A | 6/2001 |
|---|---|---|
| KR | 1020100026452 A | 3/2010 |
| KR | 1020100074945 A | 7/2010 |

* cited by examiner

*Primary Examiner* — Long K Tran
(74) *Attorney, Agent, or Firm* — Kilpatrick Townsend & Stockton LLP (57) ABSTRACT

Methods of forming an interconnection line pattern using a screen printing technique. The method includes preparing a substrate having unevenness, aligning a stencil mask on the substrate, and printing a paste including materials for forming the interconnection line pattern on a convex portion of the unevenness formed on the substrate.

20 Claims, 11 Drawing Sheets

METHODS FOR FORMING INTERCONNECTION LINE USING SCREEN PRINTING TECHNIQUE

CROSS-REFERENCE TO RELATED APPLICATION

This application claims priority under 35 U.S.C. 119(a) to Korean Application No. 10-2012-0093856 filed on Aug. 27, 2012, in the Korean Intellectual Property Office, which is incorporated herein by reference in its entirety as set forth in full.

BACKGROUND

Embodiments of the present disclosure relate to methods for manufacturing a semiconductor device, and more particularly, to methods for forming conductive film patterns or interconnection lines on a substrate using a screen printing technique.

A semiconductor package is used in a variety of products. According to the recent trend toward miniaturization and slimness of products, the size of a semiconductor package has decreased. In order to reduce the size of the semiconductor package, a flip chip package in which solder bumps are directly formed on a surface of a semiconductor die, or a through silicone via (TSV) package in which TSVs are formed on bonding pads of a semiconductor die and solder bumps are then formed on the TSVs, is being highlighted. The flip chip package or the TSV package generally includes a redistribution layer (RDL) that is connected to a bonding pad of a semiconductor die to redistribute a position where a solder bump is formed, and an under bump metal (UBM) that is connected to the RDL to increase an adhesive strength between the solder bump and the RDL.

Meanwhile, along with advances in semiconductor industry and users' demand, electronic devices are becoming smaller and lighter and semiconductor chip packages as essential components of the electronic devices are also becoming smaller and lighter accordingly. To cope with such trends, a package known as a chip stack package has been developed, in which a plurality of semiconductor chips are vertically stacked to implement a semiconductor chip package. The chip stack package is advantageous in achieving a smaller and lighter package in view of the size, weight and mounting area, compared to a case of using a plurality of unit semiconductor chip packages each having a built-in semiconductor chip. In the chip stack package, if an electrode or pad for signal transmission of a semiconductor chip is centrally positioned, it is difficult to directly connect the pad to a substrate through a wire. Thus, the pad is redistributed in a peripheral region of the chip using a redistribution layer (RDL) and then connected to the wire to complete the package. The RDL of the chip stack package is subjected to patterning processes, including plating, mask exposure, etching, and so on, to interconnect bonding pads, or a conductive material, such as silver (Ag) paste, is patterned using a printer to interconnect bonding pads. In order to secure patterning accuracy, however, it is necessary to use a high-priced equipment in the redistribution process, and the processing speed is low, unavoidably increasing the cost of the package.

SUMMARY

Example embodiments are directed to methods for forming an interconnection line pattern on a substrate using a screen printing technique.

According to some embodiments, a method of forming an interconnection line pattern using a screen printing technique includes preparing a substrate having unevenness, aligning a stencil mask on the substrate, and printing a paste including materials for forming the interconnection line pattern on a convex portion of the unevenness formed on the substrate.

In some embodiments, the preparing of the substrate having the unevenness may include forming a mask layer on the substrate to define a pattern region, and etching the substrate using the mask layer as an etching mask to form the unevenness.

In some embodiments, the stencil mask may include a pattern region having a mesh shape without a screen pattern.

In some embodiments, the paste may be a conductive paste or a non-conductive paste.

In some embodiments, the method may further include curing the paste after printing the paste.

In some embodiments, the printing the paste may include printing a non-conductive paste on the substrate, curing the printed non-conductive paste, and printing a conductive paste on the cured non-conductive paste.

In some embodiments, the printing of the paste may include placing a magnetic conductive paste on the stencil mask and printing the magnetic conductive paste on the substrate using a magnetic squeeze.

In some embodiments, the printing of the paste may include placing a magnetic conductive paste on the stencil mask, allowing the magnetic conductive paste to pass through the stencil mask using a magnetic squeeze to print the magnetic conductive paste on the substrate, and applying a magnetic force to the stencil mask to separate the magnetic conductive paste into a non-conductive layer and a conductive layer by an attractive force between conductive fillers in the magnetic conductive paste and the stencil mask.

In some embodiments, the stencil mask may include a pattern region and the pattern region may include a mesh-shaped polymer pattern having high polarity.

In some embodiments, the substrate may be prepared to include an insulation layer positioned on a convex portion of the unevenness of the substrate.

In some embodiments, the preparing of the substrate having the unevenness may include forming an insulation layer on a surface of the substrate, forming a mask layer on the insulation layer to define a pattern to be formed, and etching the insulation layer and the substrate using the mask layer as an etching mask to form the unevenness.

In some embodiments, the printing of the paste may include printing a conductive paste on the substrate, curing the printed conductive paste, and printing a non-conductive paste on the cured conductive paste.

In some embodiments, the printing of the paste may include placing a conductive paste having magnetism on the stencil mask and applying a repulsive force to the conductive paste with a magnetic squeeze to print the conductive paste on the substrate.

In some embodiments, the printing of the paste may include placing a magnetic conductive paste on the stencil mask, allowing the magnetic conductive paste to pass through the stencil mask using a magnetic squeeze to print the magnetic conductive paste on the substrate, and applying a magnetic force to the stencil mask to separate the magnetic conductive paste into a non-conductive layer and a conductive layer by a repulsive force between conductive fillers in the magnetic conductive paste and the stencil mask.

In some embodiments, the stencil mask may include a pattern region and the pattern region may include a mesh-shaped polymer pattern having no polarity.

In some embodiments, the interconnection line pattern may be a conductive pattern that electrically connects conductive regions on the semiconductor substrate to each other or a redistribution pattern of a semiconductor package.

According to alternative embodiments, a method for forming a pattern of material aligning a stencil mask on a substrate having one or more protruding portions adjacent to recessed portions, wherein the stencil mask includes a mesh portion without blocking patterns. The method also includes screen printing a paste material through the mesh portion of the stencil on the one or more protruding portions, but not the recessed portions, of the substrate.

In some embodiments, the method also includes etching the substrate to form the recessed portions and protruding portions, wherein the protruding portions are configured to form a desired pattern for receiving the paste material.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses of layers and regions are exaggerated for clarity. Like reference designators in the drawings denote like or corresponding elements, and thus their description will be omitted to avoid duplicate explanation.

FIGS. 1 to 4 are cross-sectional views illustrating a method for forming interconnection lines using a screen printing technique according to some embodiments.

Figure 1:
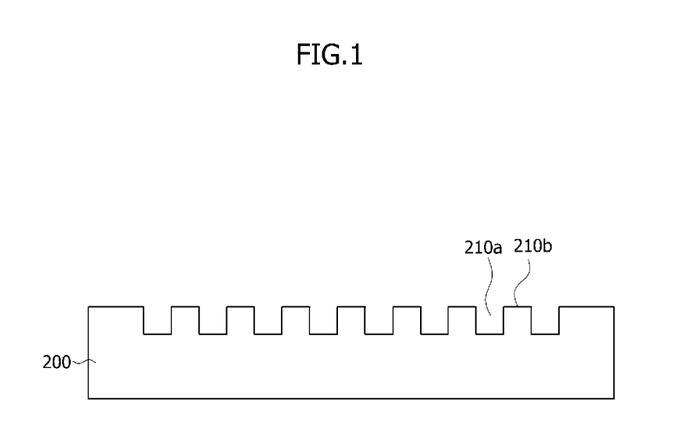
FIGS. 1 to 4 are cross-sectional views illustrating a method for forming interconnection lines using a screen printing technique according to some embodiments.

Referring to FIG. 1, a substrate 200 having unevenness 210 is first prepared. The substrate 200 may be, for example, a semiconductor substrate for forming conductive film patterns corresponding to predetermined interconnection lines of a semiconductor device or a package substrate for forming redistribution patterns of a semiconductor package.

The unevenness 210 may be formed by etching a remaining portion of the substrate 200, other than portions of the substrate 200 where interconnection line patterns are to be formed. That is to say, the portion of the substrate 200 where interconnection line pattern is to be formed, as labeled 210b, has the same height as the substrate 200, and the remaining portion of the substrate 200 is etched to form a concave portion 210a. As shown in FIG. 1, convex portion 210b includes a protruding portion adjacent to recessed portions 210a.

Figure 2:
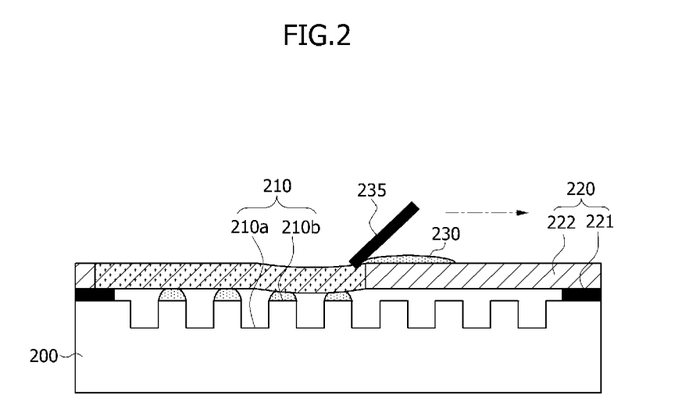

Referring to FIG. 2, a stencil mask 220 may be aligned on the substrate 200 having the unevenness 210.

Figure 5:
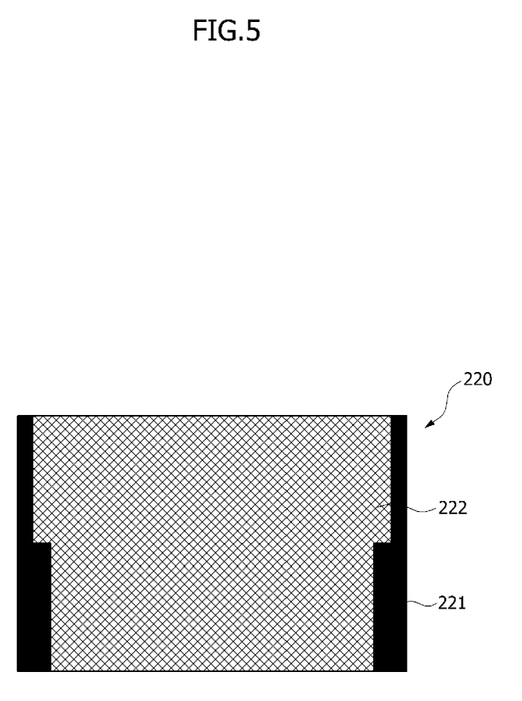
FIG. 5 illustrates a stencil mask used in formation of interconnection lines with a screen printing technique according to some embodiments.

The stencil mask 220 may be a printing mask for uniformly coating the paste on the substrate 200. In general, the stencil mask 220 has a predetermined opening pattern to allow the printing paste to flow out, and the paste is coated on the substrate in a predetermined pattern using the opening pattern. However, in the stencil mask 220 of the present embodiment, as shown in FIG. 5, a screen pattern 221 may exist only in edge portions of the stencil mask 220 and a micro-sized mesh 222 may exist in a pattern region which is located in a central portion of the stencil mask 220 without the screen pattern 221. The mesh 222 of the stencil mask may be made of a metallic material, such as stainless steel, so that it is not deformed even with pressurizing using a squeeze, etc.

After the stencil mask 220 is aligned on the substrate 200, a predetermined amount of a conductive paste 230 is placed on the stencil mask 220 and then printed using a squeeze 235. The conductive paste 230 may include all kinds of pastes, including a silver (Ag) paste, as long as they are obvious to one skilled in the related art.

If the squeeze 235 is moved while pressing the Ag paste with a predetermined pressure, the conductive paste 230 may pass through the micro-sized mesh 222 of the stencil mask 220 and may be coated on the substrate 200 to a uniform thickness. Since only the micro-sized mesh 222 exists in the stencil mask 220 corresponding to the pattern region of the substrate 200 without a screen and the unevenness 210 corresponding to the pattern is formed on the substrate 200, the conductive paste 230 does not flow in to the concave portion 210a of the substrate 200 due to surface tension but is applied only to the convex portion 210b. In other words, the paste material is printed through the mesh portion of the stencil on the one or more protruding portions 210b, but not the recessed portions 210a, of the substrate.

Figure 3:
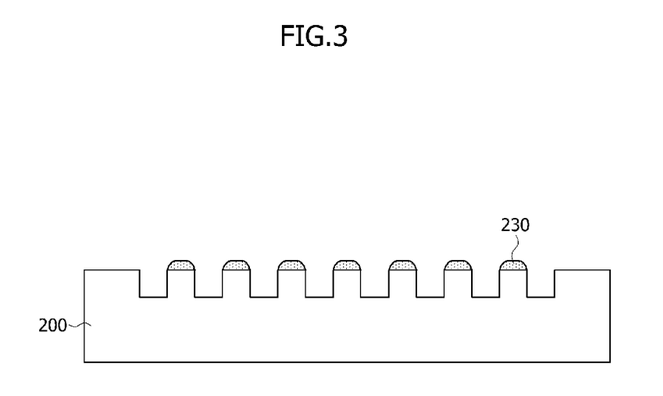

Referring to FIG. 3, after the conductive paste 230 is printed, the stencil mask 220 may be removed from the substrate 200. Then, the conductive paste 230 may be coated only on the convex portion 210b of the substrate 200 due to surface tension of the conductive paste 230. Next, since the conductive paste 230 is viscous, it should be cured so as to be used as a circuit pattern. Thus, the conductive paste 230 coated on the substrate 200 is cured using heat to form an interconnection line pattern.

Figure 4:
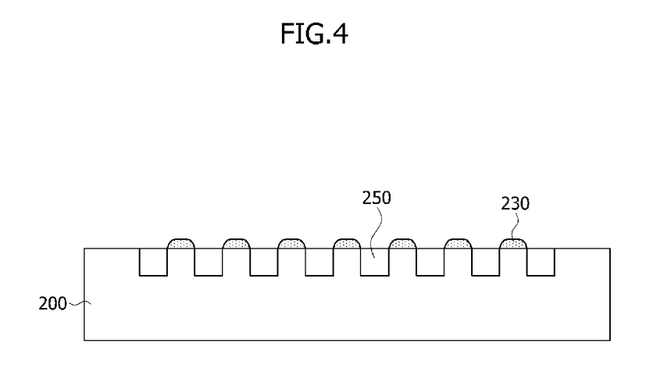

Referring to FIG. 4, a concave portion 210a formed in the substrate 200 may be filled with an insulating material 250 to complete the interconnection line pattern. The insulating material 250 may be, for example, a polymer such as epoxy, and may be applied to a thickness enough to fill the concave portion 210a formed in the substrate 200.

As described above, in the interconnection line forming method according to the present embodiment, unevenness is formed to define a pattern on the substrate and a conductive paste is printed thereon using a stencil mask having a micro-sized mesh, thereby accurately printing the conductive paste at a desired location. Therefore, according to the present embodiment, a short circuit does not occur between interconnection line patterns. In addition, micro-sized patterns can be formed by, compared to a case of using other printing method. Further, it is possible to form interconnection lines without use of a high priced plating equipment or a printing equipment based on a writing method.

Figure 6A:
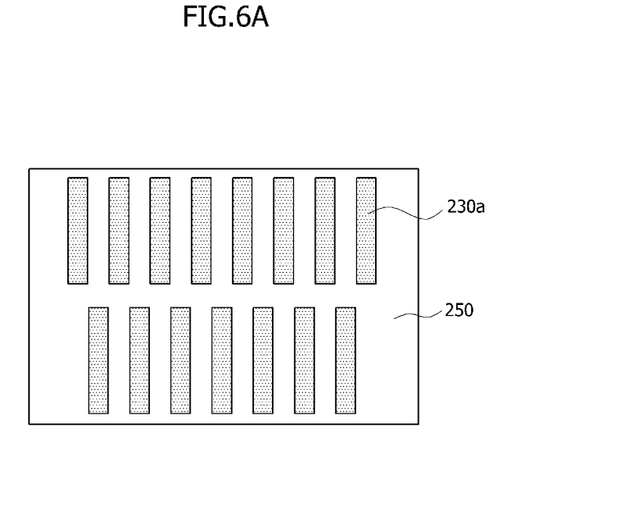
FIGS. 6A to 6C are plan views illustrating various interconnection line patterns fabricated according to some embodiments.
Figure 6B:
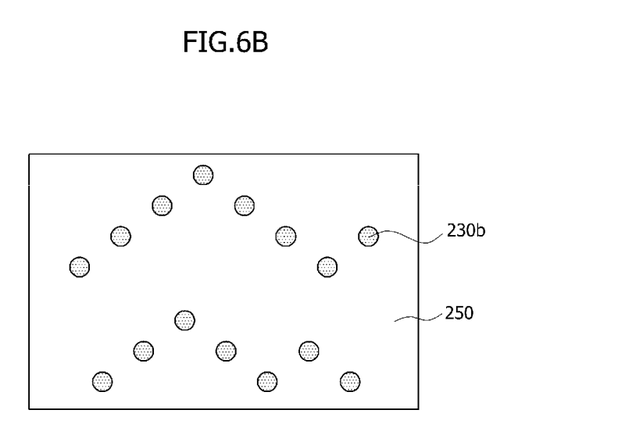
Figure 6C:
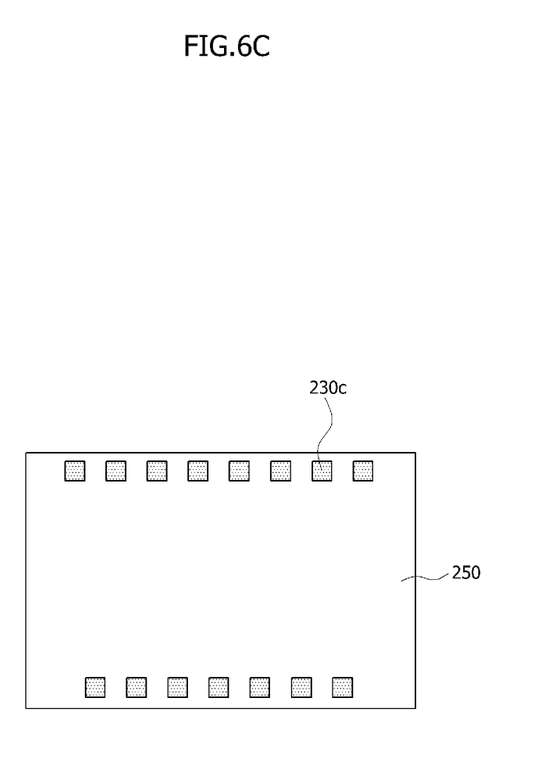

FIGS. 6A to 6C are plan views illustrating various interconnection line patterns fabricated according to some embodiments.

Reference numerals 230a, 230b and 230c denote RDL patterns formed using a mesh-type stencil mask without a screen, and reference numeral 250 denotes an insulation film filling the concave portion formed in the substrate. As shown in FIGS. 6A, 6B and 6C, the RDL patterns 230a, 230b and 230c may be formed to have various shapes according to pattern forming purposes. However, the RDL patterns can be formed in various types in addition to the illustrated types. As described above, according to the present embodiment, since the RDL patterns can be formed in various types, it is possible to adaptively cope with packaging technology using TSV with an increased number of I/O pads.

Various embodiments of a method for forming an interconnection line using screen printing according to the present invention will now be described.

Figure 7A:
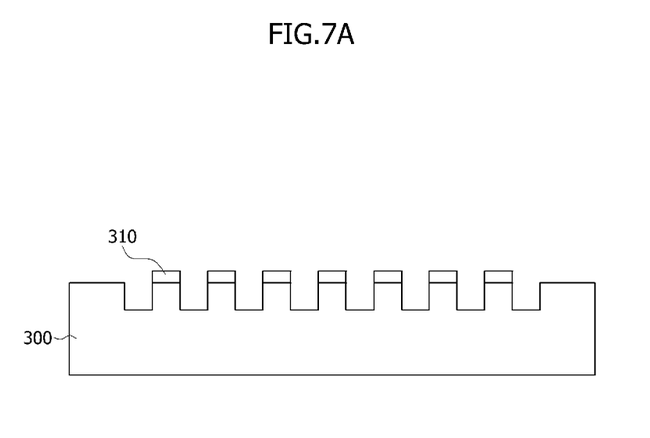
FIGS. 7A and 7B are cross-sectional views illustrating a method for forming interconnection lines using a screen printing technique according to some embodiments.
Figure 7B:
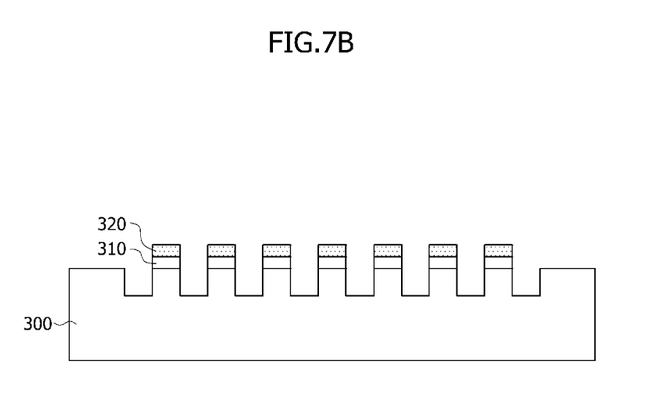

FIGS. 7A and 7B are cross-sectional views illustrating a method for forming interconnection lines using a screen printing technique according to some embodiments.

Since an interconnection line pattern is formed of a conductive paste, a short circuit may occur between the interconnection line pattern and a conductive layer formed in a chip where the interconnection line pattern is to be formed, in a case where no insulation layer exists on a surface of the chip. Therefore, as shown in FIG. 7A, a substrate 300 having unevenness is prepared and a non-conductive paste 310 is primarily printed on the substrate 300 using a stencil mask and a squeeze. Examples of the non-conductive paste 310 may include epoxy, silicon, acryl, polyester, polyimide, and so on. In addition to the listed materials, various kinds of non-conductive pastes can be used as the non-conductive paste 310.

The printing of the non-conductive paste 310 on the substrate 300 may be performed in the same manner as the printing of the conductive paste 230 shown in FIGS. 1 to 4. Here, like in the case shown in FIGS. 1 to 4, the non-conductive paste 310 is printed only on a convex portion of the unevenness formed on the substrate 300 due to surface tension. The non-conductive paste 310 is printed using the stencil mask and the squeeze and then cured, thereby forming a non-conductive pattern.

Next, as shown in FIG. 7B, a conductive paste 320 is printed on the resultant structure having the non-conductive pattern 310 and then cured, thereby forming an interconnection line pattern without being shorted from a conductive layer of the substrate 300.

According to this embodiment, when there is no insulation layer on a chip surface where an interconnection line pattern is to be formed, a non-conductive paste is primarily printed using a screen printing technique and a conductive paste is then secondarily printed, thereby forming the interconnection line pattern electrically insulated from the conductive layer of the substrate.

Figure 8A:
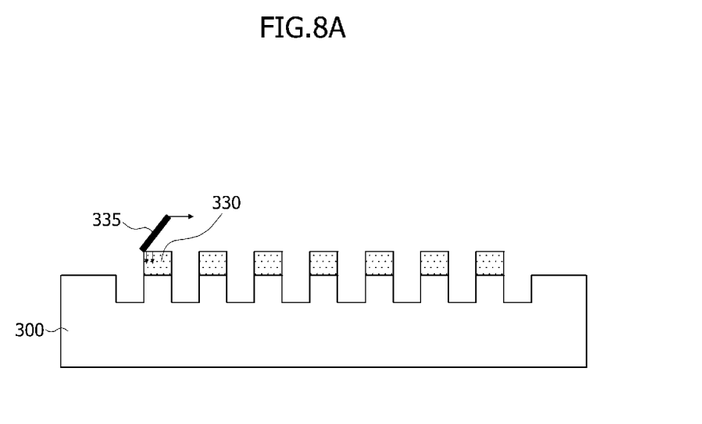
FIGS. 8A and 8B are cross-sectional views illustrating a method for forming interconnection lines using a screen printing technique according to some embodiments.
Figure 8B:
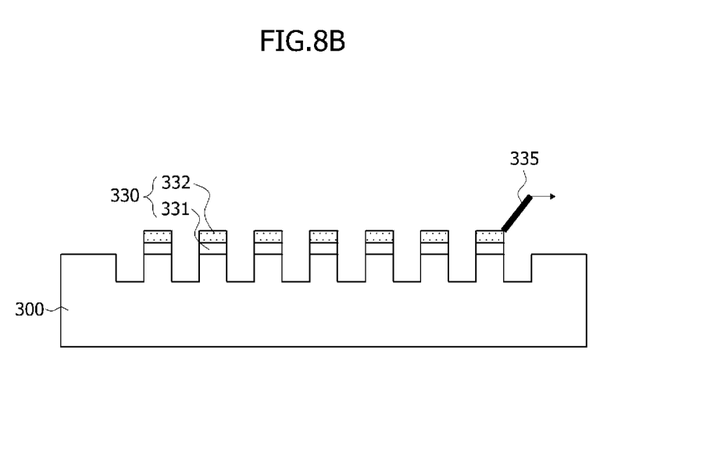

FIGS. 8A and 8B are cross-sectional views illustrating a method for forming interconnection lines using a screen printing technique according to some embodiments.

In a case where an insulation layer is not formed on a substrate on which an interconnection line pattern is to be formed, the interconnection line pattern may be formed while preventing a short circuit from occurring by a magnetic conductive paste and a magnetic squeeze, as described in the following embodiment.

Referring to FIGS. 8A and 8B, a conductive paste 330 may be printed on a substrate 300 having unevenness, as described with reference to FIGS. 1 to 4, using a stencil mask and a squeeze 335. Here, a magnetic conductive paste may be used as the conductive paste 330, and a magnetic squeeze may be used as the squeeze 335. The magnetic conductive paste 330 may include a non-conductive paste layer 331 and magnetic conductive fillers 332. Therefore, if the magnetic conductive paste 330 is printed using the magnetic squeeze 335, the magnetic squeeze 335 applies an attractive force to the conductive fillers 332 of the conductive paste 330 to allow the conductive fillers 332 to be collected on an overlying layer of the paste 330. If an appropriate attractive force is applied between the squeeze 335 and the fillers 332 of the conductive paste 330, the paste layer may be separated into the conductive fillers 332 and the non-conductive paste layer 331 as shown in FIG. 8B. Therefore, a conductive layer pattern including the overlying conductive fillers 332 may be electrically insulated from the conductive layer of the substrate 300 by the underlying non-conductive paste layer 331, thereby preventing the overlying conductive fillers 332 from being electrically connected to the substrate 300. In some embodiments, a non-magnetic squeeze instead of the magnetic squeeze may be used and a magnetic stencil mask instead of the stencil mask (e.g., a non-magnetic stencil mask) may be used. Even in such a case, the same effect as the embodiment illustrated in FIGS. 8A and 8B can be obtained.

Figure 9A:
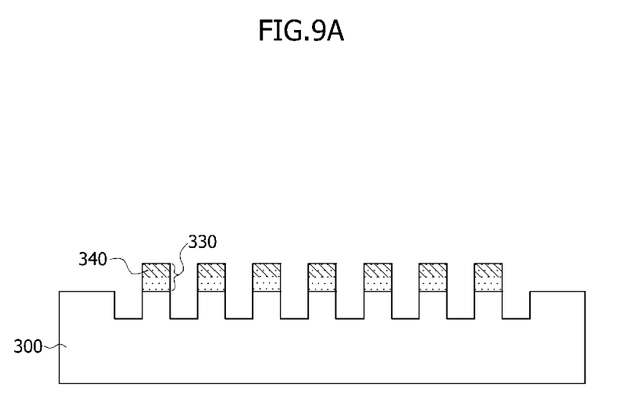
FIGS. 9A and 9B are cross-sectional views illustrating a method for forming interconnection lines using a screen printing technique according to some embodiments.
Figure 9B:
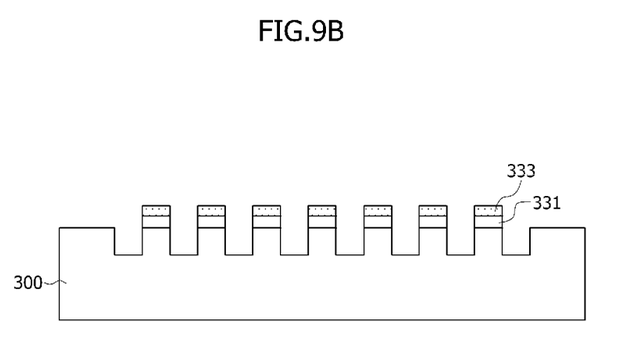

FIGS. 9A and 9B are cross-sectional views illustrating a method for forming interconnection lines using a screen printing technique according to some embodiments. In a case where an insulation layer is not formed on a surface of a substrate on which an interconnection line pattern is to be formed, the interconnection line pattern insulated from the substrate can be formed using a stencil mask having a polar polymer mesh and using a conductive paste as described in the following embodiment illustrated in FIGS. 9A and 9B.

Referring to FIGS. 9A and 9B, a conductive paste 330 may be printed on a substrate 300 having unevenness using a stencil mask and a squeeze, as described with reference to FIGS. 1 to 4. Here, the stencil mask 340 may be formed to include a highly polar polymer material and to have a mesh shape. If the conductive paste 330 is printed using the stencil mask formed of the highly polar polymer mesh 340, conductive particles coated with non-polar molecules may rapidly pass through the polymer mesh of the stencil mask 340 and a polar paste resin of the conductive paste 330 may slowly pass through the polymer mesh of the stencil mask 340 by dipole's force that is an attractive force between polar molecules when the paste is squeezed. As the result, the conductive particles coated with the non-polar molecules may be collected on top of the paste layer, and as shown in FIG. 9B, the conductive paste 330 may be separated into a non-conductive paste layer 331 and a conductive paste layer 333 which are sequentially stacked. Therefore, since the underlying non-conductive paste layer 331 serves as an insulation layer, the interconnection line pattern formed of the overlying conductive paste layer 333 may be electrically insulated from a conductive layer of the substrate 300 because of the presence of the underlying non-conductive paste layer 331.

Next, embodiments whose interconnection line patterns are easily formed using a screen printing technique while protecting the interconnection line patterns will be described in conjunction with a case where an insulation layer is formed on a chip where the interconnection line patterns are to be formed.

Figure 10A:
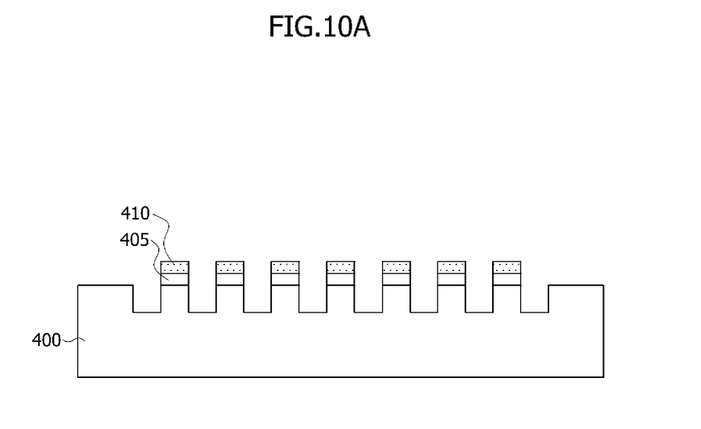
FIGS. 10A and 10B are cross-sectional views illustrating a method for forming interconnection lines using a screen printing technique according to some embodiments.
Figure 10B:
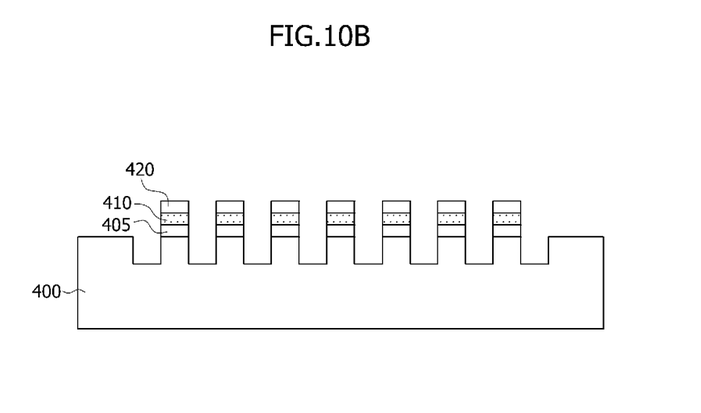

FIGS. 10A and 10B are cross-sectional views illustrating a method for forming interconnection lines using a screen printing technique according to some embodiments, by which an interconnection line pattern can be protected.

Referring to FIG. 10A, a substrate 400 having unevenness may be prepared, and a conductive paste 410 may be primarily printed on the substrate 400 with a stencil mask and a squeeze using the same manners as described with reference to FIGS. 1 to 4. A silver (Ag) paste, for example, may be used as the conductive paste 410. Here, since an insulation layer 405 is disposed on a surface of the substrate 400, there may be no probability that the conductive paste 410 (e.g., interconnection line pattern) is electrically connected to a conductive layer on a surface of the substrate 300. In a case where the insulation layer 405 is formed on an entire flat surface of the substrate 400, etching of the insulation layer 405 is performed when unevenness of the substrate 400 is formed to define areas of the interconnection line pattern. The conductive paste 410 may be printed on the insulation layer 405 positioned on a convex portion of the unevenness formed on the substrate 400 due to surface tension of the conductive paste 410 and then cured to form the interconnection line pattern.

Referring to FIG. 10B, a non-conductive paste 420 may be printed on a surface of the interconnection line pattern including the conductive paste 410 and the printed non-conductive paste 420 may then be cured to form a protection film for protecting the interconnection line pattern. Examples of the conductive paste 410 may include epoxy, silicon, acryl, polyester, polyimide, and so on. In addition to the listed materials, various kinds of non-conductive pastes can be used. The printing of the non-conductive paste 420 on the interconnection line pattern may be performed using the same manner as the printing method shown in FIGS. 7A and 7B.

According to this embodiment, the protection film for protecting the interconnection line pattern may be formed without use of a separate photolithography process.

Figure 11A:
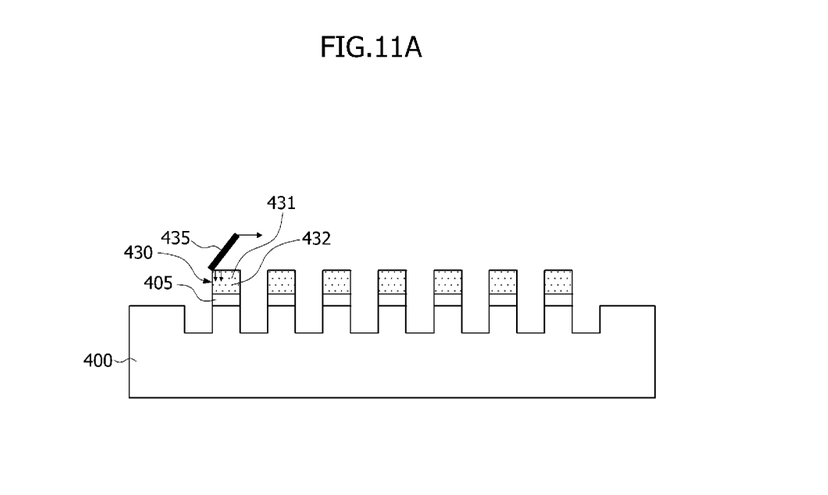
FIGS. 11A and 11B are cross-sectional views illustrating a method for forming interconnection lines using a screen printing technique according to some embodiments.
Figure 11B:
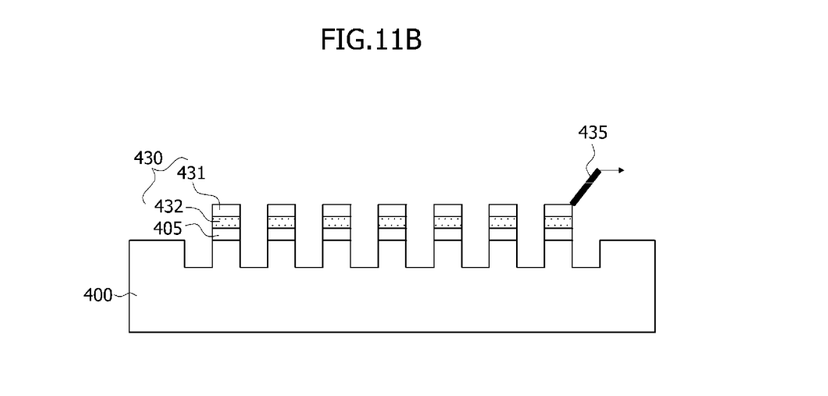

FIGS. 11A and 11B are cross-sectional views illustrating a method for forming interconnection lines using a screen printing technique according to some embodiments, by which an interconnection line pattern can be protected.

Referring to FIGS. 11A and 11B, a conductive paste 430 is printed on a substrate 400 having unevenness using a stencil mask and a squeeze 435. A magnetic conductive paste may be used as the conductive paste 430, and a magnetic squeeze may be used as the squeeze 435. The magnetic conductive paste 430 may be a paste including a non-conductive paste layer 431 and magnetic conductive fillers 432. Here, materials of the conductive paste 430 and the squeeze 435 may be selected such that the conductive paste 430 and the squeeze 435 have polarities exhibiting a repulsive force toward each other.

As described above, if the magnetic conductive paste 430 is printed using the magnetic squeeze 435, the magnetic squeeze 435 applies a repulsive force to the conductive fillers 432 contained in the magnetic conductive paste 430, so that molecules of the conductive fillers 432 are collected at bottom of the magnetic conductive paste 430. If an appropriate repulsive force is applied between the squeeze 435 and the conductive fillers 432 of the magnetic conductive paste 430, a layer formed of the conductive paste 430 is separated into a conductive paste layer including the conductive fillers 432 and a non-conductive paste layer 431 as illustrated in FIG. 11B. Therefore, the overlying non-conductive paste layer 431 serves as a protection film for protecting a conductive layer pattern including the underlying conductive fillers 432.

In some embodiments, a non-magnetic squeeze may be used instead of the magnetic squeeze 435 and a magnetic stencil mask may be used as the stencil mask (e.g., a non-magnetic stencil mask) with the magnetic conductive paste 430. Even in such a case, the same effect as the embodiment illustrated in FIGS. 11A and 11B can be obtained. In this case, after a magnetic conductive paste is printed using the magnetic stencil mask, an appropriate voltage may be applied to the magnetic stencil mask. Then, a repulsive force based on electrostatic force is applied to a mesh board of the magnetic stencil mask, so that molecules of the conductive fillers 432 of the conductive paste 430 may be collected in an underlying layer opposite to the mesh board. Eventually, a layer of the conductive paste 430 is separated into an underlying conductive paste layer including the conductive fillers 432 and an overlying non-conductive paste layer 431. The overlying non-conductive paste layer 431 serves as a protection film for protecting the underlying conductive layer pattern including the conductive fillers 432.

Figure 12A:
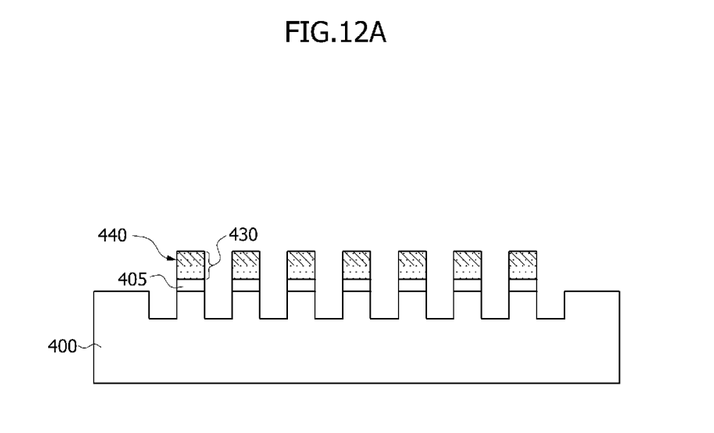
FIGS. 12A and 12B are cross-sectional views illustrating a method for forming interconnection lines using a screen printing technique according to some embodiments.
Figure 12B:
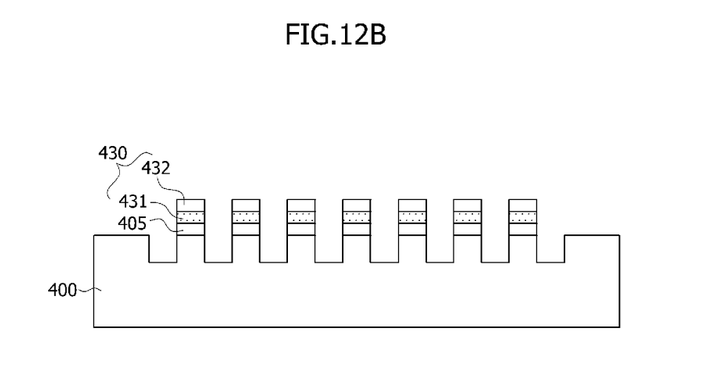

FIGS. 12A and 12B are cross-sectional views illustrating a method for forming interconnection lines using a screen printing technique according to some embodiments, by which an interconnection line pattern can be protected.

Referring to FIG. 12A, a conductive paste 430 may be printed on a substrate 400 having an insulation layer 405 and unevenness using a stencil mask and a squeeze. Here, a stencil mask formed of a non-polar polymer mesh 440 may be used as the stencil mask. If the conductive paste 430 is printed using the stencil mask formed of the non-polar polymer mesh 440, conductive particles coated with polar molecules may rapidly pass through the polymer mesh 440 of the stencil mask when the conductive paste is squeezed while non-polar paste resin molecules may slowly pass through the polymer mesh 440 due to a Van der Waals force that is an attractive force between molecules. As the result, non-conductive particles may be collected on top of the paste layer, which is separated into a conductive paste layer 431 and a non-conductive paste layer 433. Therefore, the overlying non-conductive paste layer 433 serves as a protection film for protecting the interconnection line pattern including the underlying conductive paste layer 431.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method for forming an interconnection line pattern, the method comprising:
   preparing a substrate having unevenness;
   aligning a stencil mask on the substrate; and
   printing a paste including materials for forming the interconnection line pattern on a convex portion of the unevenness formed on the substrate.

2. The method of claim 1, wherein the preparing of the substrate having the unevenness includes:
   forming a mask layer on the substrate to define a pattern region; and etching the substrate using the mask layer as an etching mask to form the unevenness.

3. The method of claim 1, wherein the stencil mask includes a pattern region having a mesh shape without a screen pattern.

4. The method of claim 1, wherein the paste is a conductive paste or a non-conductive paste.

5. The method of claim 1, further comprising curing the paste after printing the paste.

6. The method of claim 1, wherein the printing the paste includes:
   printing a non-conductive paste on the substrate;
   curing the printed non-conductive paste; and
   printing a conductive paste on the cured non-conductive paste.

7. The method of claim 1, wherein the printing of the paste includes:
   placing a magnetic conductive paste on the stencil mask; and
   printing the magnetic conductive paste on the substrate using a magnetic squeeze.

8. The method of claim 1, wherein the printing of the paste includes:
   placing a magnetic conductive paste on the stencil mask;
   allowing the magnetic conductive paste to pass through the stencil mask using a magnetic squeeze to print the magnetic conductive paste on the substrate; and
   applying a magnetic force to the stencil mask to separate the magnetic conductive paste into a non-conductive layer and a conductive layer by an attractive force between conductive fillers in the magnetic conductive paste and the stencil mask.

9. The method of claim 1, wherein the stencil mask includes a pattern region that includes a mesh-shaped polar polymer pattern.

10. The method of claim 1, wherein the substrate is prepared to include an insulation layer positioned on a convex portion of the unevenness of the substrate.

11. The method of claim 10, wherein the preparing of the substrate having the unevenness includes:
    forming an insulation layer on a surface of the substrate;
    forming a mask layer on the insulation layer to define a pattern to be formed; and
    etching the insulation layer and the substrate using the mask layer as an etching mask to form the unevenness.

12. The method of claim 10 wherein the printing of the paste includes:
    printing a conductive paste on the substrate;
    curing the printed conductive paste; and
    printing a non-conductive paste on the cured conductive paste.

13. The method of claim 10, wherein the printing of the paste includes:
    placing a conductive paste having magnetism on the stencil mask; and
    applying a repulsive force to the conductive paste with a magnetic squeeze to print the conductive paste on the substrate.

14. The method of claim 10, wherein the printing of the paste includes:
    placing a magnetic conductive paste on the stencil mask;
    allowing the magnetic conductive paste to pass through the stencil mask using a magnetic squeeze to print the magnetic conductive paste on the substrate; and
    applying a magnetic force to the stencil mask to separate the magnetic conductive paste into a non-conductive layer and a conductive layer by a repulsive force between conductive fillers in the magnetic conductive paste and the stencil mask.

15. The method of claim 10, wherein the stencil mask includes a pattern region that includes a mesh-shaped non-polar polymer pattern.

16. The method of claim 1, wherein the interconnection line pattern is a conductive pattern that electrically connects conductive regions on the semiconductor substrate to each other or a redistribution pattern of a semiconductor package.

17. The method of claim 1, wherein the substrate having unevenness comprises one or more protruding portions adjacent to recessed portions, wherein printing the paste results in the paste material being disposed only on the one or more protruding portions, but not the recessed portions, of the substrate.

18. A method for forming a pattern of material, the method comprising:
    aligning a stencil mask on a substrate having one or more protruding portions adjacent to recessed portions, wherein the stencil mask includes a mesh portion without blocking patterns; and
    screen printing a paste material through the mesh portion of the stencil on the one or more protruding portions, but not the recessed portions, of the substrate.

19. The method of claim 18, further including etching the substrate to form the recessed portions and protruding portions, wherein the protruding portions are configured to form a desired pattern for receiving the paste material.

20. The method of claim 18, wherein the printing of the paste material includes:
    placing a magnetic conductive paste on the stencil mask;
    allowing the magnetic conductive paste to pass through the stencil mask using a magnetic squeeze to print the magnetic conductive paste on the substrate; and
    applying a magnetic force to the stencil mask to separate the magnetic conductive paste into a non-conductive layer and a conductive layer by a repulsive force between conductive fillers in the magnetic conductive paste and the stencil mask.

* * * * *